Oct. 4, 1966 P. W. SAUNDERS 3,277,382
PULSE AMPLITUDE DISCRIMINATOR
Filed March 19, 1963
PRIOR ART FIG. 1
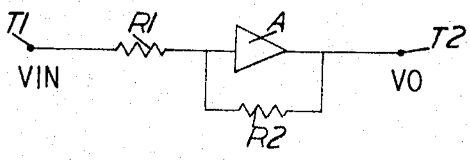
FIG. 2
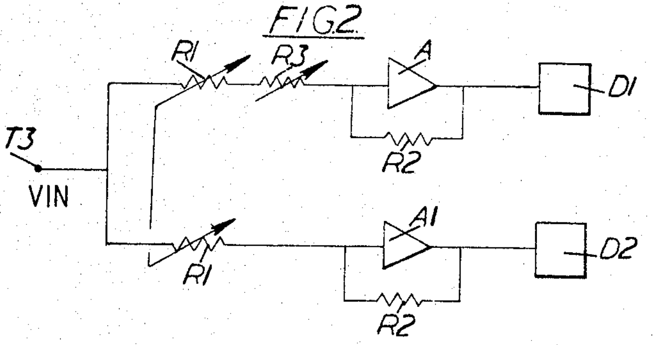
FIG. 3
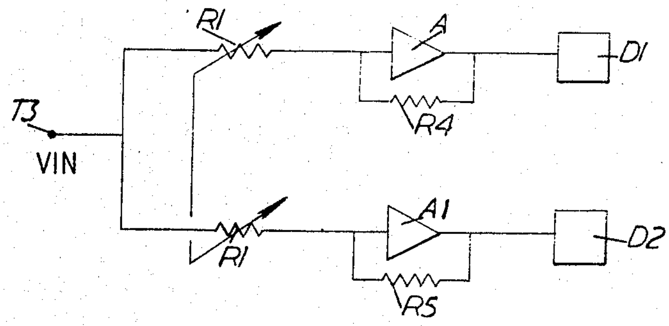
Inventor
PATRICK WILLIAM SAUNDERS
By Browne, Schuyler & Beveridge
Attorneys United States Patent Office 3,277,382

Patented Oct. 4, 1966

3,277,382

PULSE AMPLITUDE DISCRIMINATOR

Patrick William Saunders, Southend-on-Sea, England, assignor to E. K. Cole Limited, Southend-on-Sea, England Filed Mar. 19, 1963, Ser. No. 266,434
Claims priority, application Great Britain, Mar. 22, 1962, 10,934/62
4 Claims. (Cl. 328—116)

This invention relates to circuits for translating signal pulses which lie between predetermined voltage levels. Circuits of this type are of particular use in, for example, nucleonic pulse counting equipment or the like. For instance it may be desired to provide a pulse translating circuit adapted to produce a voltage VO at one output terminal when the input voltage is not less than V1 and to produce the voltage VO at a second output terminal, only when the input voltage is not less than $V1+V2$. The voltage V1 is usually termed the threshold voltage and V2 the gatewidth. It is often required that the threshold voltage and gatewidth be variable.

An object of the present invention is, in such pulse translating circuit, to provide simple means for effecting the variation in threshold voltage and gatewidth and in doing this we make use of a combination of linear amplifiers each of a type comprising a feedback resistance, a second resistance being connected in series in the amplifier input and the arrangement being such that when certain resistance relations are observed the amplifier output voltage may be made directly proportional to its input voltage. So operating, the amplifier gain is equal to this resistance ratio. We shall use the term "linear amplifier of the said type" to mean an amplifier so arranged. The amplifier itself may comprise one or more stages of amplification and where two or more such stages are used, the feedback resistance will be between the output of the last stage and the input of the first stage and the said series resistor will be in the input of the first stage.

The invention will be more readily understood by a perusal of the following description having reference to the accompanying drawings in which FIGURE 1 is a circuit diagram of a known form of linear amplifier of the said type, FIGURE 2 is a diagram of a circuit according to the invention and FIGURE 3 is a modified form of FIGURE 2.

In the circuit of the linear amplifier shown in FIGURE 1, a resistor R1 and an amplifier A are connected in series between an input terminal T1 and an output terminal T2. The amplifier A may comprise one or more amplifier stages. Shunting A is a feedback resistor R2. In operation an input voltage (VIN) is applied to T1 and a corresponding output voltage (VO) is developed at T2. When the gain of A is very much greater than the ratio $R2/R1$, the circuit will operate as a linear amplifier with the overall gain of $VO/VIN=R2/R1$.

FIGURE 2 shows two linear amplifiers of the type described with reference to FIGURE 1. One of the linear amplifiers comprises a resistor R1 in series with an amplifier A1 which is shunted by a resistor R2, while the other linear amplifier comprises an amplifier A and is of similar construction except that a further resistor R3 is connected in series with the resistor R1. The inputs of the linear amplifiers are connected to a common terminal T3, the outputs of the linear amplifiers being connected to devices D1 and D2 respectively. These devices D1 and D2 may be of any known type, e.g. monostable devices, which supply an output voltage when the input voltage for the devices is equal to or exceeds a predetermined level, say VD, which is the same for both devices. The resistors R1 are both variable and are ganged together in such a manner that the values of the resistors R1 are always of equal resistance value. By ganging the resistors R1, the gain of both of the linear amplifiers may conveniently be controlled in a single operation. The gains of the linear amplifiers are arranged to be different, due to R3, and hence the minimum amplitude of the input signal applied to T3 to operate D1 must be greater than that required to operate D2. When $V1+V2$ is the minimum input voltage (VIN) required to provide an input voltage VD for the device D1, and V1 is the minimum input voltage (VIN) required to provide an input voltage VD for the device D2, $$V1+V2=\frac{VD(R1+R3)}{R2}$$

and $$V1=\frac{VD.R1}{R2}$$

and hence $$V2=\frac{VD.R3}{R2}$$

Since VD and R2 are constant, V2 is therefore directly proportional to R3. Also the minimum input voltage V1 required to obtain the output voltage VD is directly proportional to R1. Such a circuit is of particular use in, for example, nucleonic counting equipment where it is necessary to count only those voltage pulses whose amplitudes lie between predetermined levels, i.e. those pulses which operate only D2· As has been previously stated the lower of these levels (V1) is usualy referred to as the threshold level, while the difference between the amplitudes (V2) is usually referred to as the gatewidth. It will be appreciated that in the circuit of FIGURE 2 the threshold level will be determined by the setting of the resistors R1 and the gatewidth by the setting of R3. However, in some applications of nucleonic counting equipment it is required that the gatewidth be proportional to the threshold level. Such an arrangement is shown in FIGURE 3.

This figure is of similar construction to that shown in FIGURE 2 except that R3 has been removed and the feedback resistors R4 and R5 across the amplifiers A and A1 respectively are of different values. When R5 is made greater than R4, then $$V1=\frac{VD.R1}{R5}$$

and $$V1+V2=\frac{VD.R1}{R4}$$

and therefore $$V2=VD.R1\left(\frac{1}{R4}-\frac{1}{R5}\right)$$

Since R4 and R5 are constant and are not equal, the gatewidth (V2) is proportional to R1, i.e. the gatewidth is proportional to the threshold level (V1).

It will be appreciated that the invention is applicable to circuits employing either valves or transistors.

I claim:

1. A pulse amplitude discriminator circuit having a first signal translating path and a second signal translating path both connected to a common signal input terminal, each said path comprising an amplifier with a resistance serially connected between its input and said common input terminal and with a resistance providing overall feedback for the amplifier, a separate output circuit for each amplifier, a first signal pulse responsive device in the output circuit of the amplifier of said first path and a second signal pulse responsive device in the output circuit of the amplifier of said second path, each signal pulse responsive device being responsive to pulses received from its respective amplifier which exceed a predetermined level, each said amplifier having a gain which is substantially greater than the ratio of its feedback resistance to its series resistance whereby the paths provide linear amplification of all pulses appearing at said common input terminal, the pulse amplification of the linear amplifiers being equal to the respective said ratio of feedback resistance to series resistance, the said ratio in respect of said first path being greater than the said ratio in respect, said second path so determining the threshold level and gatewidth of the discriminator, and at least one of said resistances of each said path being variable to select said threshold level and said gatewidth.

2. A pulse amplitude discriminator circuit according to claim 1, incorporating a fixed resistance for one of said resistances of said first path and a fixed resistance for the corresponding one of said resistances of said second path, a first variable resistor to provide the other of said resistances of said first path and a second variable resistor to provide the other of said resistances of said second path, a value for one of said fixed resistances which is greater than the value for the other of said fixed resistances, for said first variable resistor a value which is equal to the value of said second variable resistor, and means for jointly varying the values of said first variable resistor and said second variable resistor to select the threshold level and the gatewidth of the discriminator.

3. A pulse amplitude discriminator circuit according to claim 1, incorporating a fixed resistance for one of said resistances of said first path and a fixed resistance for the corresponding one of said resistances of said second path, a first variable resistor and a second variable resistor for the other of said resistances of said first path and a third variable resistor for the other of said resistances of said second path, equal values for said fixed resistances, for the first variable resistor a value which is equal to the value of the third variable resistor, means for jointly varying the values of the first variable resistor and the third variable resistor to determine the threshold level of the discriminator, and means for varying the value of the second variable resistor to select the gatewidth of the discriminator.

4. A pulse amplitude discriminator according to claim 1, in which the predetermined level at which each pulse responsive device is responsive to pulses received from its respective linear amplifier is the same for both devices.

References Cited by the Examiner

UNITED STATES PATENTS

| | | | |
|---|---|---|---|
| 2,775,657 | 12/1956 | Van Zelst | 330—124 X |
| 2,810,828 | 10/1957 | Gray et al. | 328—116 |
| 2,883,615 | 4/1959 | Gilbert | 328—116 X |
| 2,984,789 | 5/1961 | O'Brien | 328—63 X |
| 3,004,167 | 10/1961 | Owen | 250—71.5 X |
| 3,018,442 | 1/1962 | Goodman | 328—150 |
| 3,077,566 | 2/1963 | Vosteen | 330—30 X |

OTHER REFERENCES

Seely, Electron-Tube Circuits, McGraw-Hill, New York, 1958, 2nd edition, TK 787-54, pages 255–257.

NATHAN KAUFMAN, *Acting Primary Examiner.*

ROY LAKE, *Examiner.*

R. P. KANANEN, J. B. MULLINS, *Assistant Examiners.*